(12) United States Patent
Kim et al.

(10) Patent No.: US 11,737,379 B2
(45) Date of Patent: Aug. 22, 2023

(54) ANTENNA ASSISTED RERAM FORMATION

(71) Applicant: International Business Machines Corporation, Armonk, NY (US)

(72) Inventors: Youngseok Kim, Upper Saddle River, NJ (US); Soon-Cheon Seo, Glenmont, NY (US); Injo Ok, Loudonville, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 261 days.

(21) Appl. No.: 17/159,739

(22) Filed: Jan. 27, 2021

(65) Prior Publication Data

US 2022/0238803 A1 Jul. 28, 2022

(51) Int. Cl.
| H01L 45/00 | (2006.01) |
| H10N 70/00 | (2023.01) |
| H10B 63/00 | (2023.01) |
| H10N 70/20 | (2023.01) |

(52) U.S. Cl.
CPC ........... *H10N 70/011* (2023.02); *H10B 63/20* (2023.02); *H10N 70/24* (2023.02); *H10N 70/257* (2023.02); *H10N 70/841* (2023.02)

(58) Field of Classification Search
CPC ...................................................... H01L 45/00
See application file for complete search history.

(56) References Cited

U.S. PATENT DOCUMENTS

| 6,028,324 A | 2/2000 | Su et al. |
| 6,292,927 B1 | 9/2001 | Gopisetty et al. |
| 8,148,797 B2 | 4/2012 | Weng et al. |
| 8,624,218 B2 | 1/2014 | Chen |
| 8,934,285 B2 | 1/2015 | Sutardja et al. |
| 9,012,880 B2 | 4/2015 | Jang et al. |

(Continued)

FOREIGN PATENT DOCUMENTS

| CN | 110350083 A | 10/2019 |
| WO | 2013134757 A1 | 9/2013 |

OTHER PUBLICATIONS

Koji Eriguchi et al., "High-k MOSFET performance degradation by plasma process-induced charging damage—impacts on device parameter variation," IEEE International Integrated Reliability Workshop Final Report, 2012, pp. 80-84.

(Continued)

*Primary Examiner* — Marvin Payen
(74) *Attorney, Agent, or Firm* — Peter J. Edwards

(57) ABSTRACT

A memory structure comprises a ReRAM module embedded in a substrate. An insulative layer is formed on the substrate. A first electrode is located on the insulative layer. The first electrode is proximately connected to a first end of the ReRAM module and comprises a first surface area. A second electrode is located on the insulative layer. The second electrode is proximately connected to a second end of the ReRAM module. The second electrode comprises a second surface area, a plasma-interacting component, and a resistive component. The resistive component is located between the plasma-interacting component and the ReRAM module. A ratio of the first surface area to the second surface area creates a voltage between the first electrode and second electrode when the first surface area and second surfaces area are exposed to an application of plasma. The voltage forms a conductive filament in the ReRAM module.

20 Claims, 10 Drawing Sheets

(56) References Cited

U.S. PATENT DOCUMENTS

| | | |
|---|---|---|
| 10,032,779 B2 | 7/2018 | Satou |
| 2015/0053908 A1 | 2/2015 | Fowler |
| 2020/0050731 A1 | 2/2020 | Yu et al. |

OTHER PUBLICATIONS

Koji Eriguchi et al., "Analytic Model of Threshold Voltage Variation Induced by Plasma Charging Damage in High-k Metal-Oxide-Semiconductor Field-Effect Transistor," Jpn. J. Appl. Phys., 2011, 50, 10PG02, 8 pages https://iopscience.iop.org/article/10.1143/JJAP.50.10PG02/pdf.

ANTENNA ASSISTED RERAM FORMATION

BACKGROUND

The present disclosure relates to memory modules, and more specifically, to forming ReRAM modules.

Random access memory (referred to herein as "RAM") is a storage class used in computer storage systems. RAM comes in several forms, many of which are useful for fast access to information inside and outside a processor cache. As such, some types of RAM are installed on a system board, such as a motherboard. These types of RAM can store information in different ways, depending on the format of the RAM. Some types, for example, store a bit of information (e.g., a "1" or a "0") by varying the states of a transistor-capacitor pair in the RAM cell. Some types store a bit of information by varying the state of the electrical resistance across the RAM cell.

SUMMARY

Some embodiments of the present disclosure can be illustrated as a method of forming a ReRAM conductive filament. The method comprises exposing a first electrode to an application of plasma. The first electrode is proximately connected to a first end of a ReRAM module. The method further comprises exposing a second electrode to the application of plasma. The second electrode is proximately connected to a second end of the ReRAM module. The second electrode comprises a plasma-interacting component and a resistive component located between the plasma-interacting component and the ReRAM module. Exposing the first and second electrodes to the application of plasma creates a voltage between the first and second electrodes, and the voltage creates a conductive filament in the ReRAM module.

Some embodiments of the present disclosure can be illustrated as a memory structure. The memory structure comprises a ReRAM module embedded in a substrate. The memory structure also comprises an insulative layer on the surface of the substrate. The memory structure also comprises a first electrode on a surface of the insulative layer. The first electrode is proximately connected to a first end of the ReRAM module, and comprises a first surface area. The memory structure also comprises a second electrode on the surface of the insulative layer. The second electrode is proximately connected to a second end of the ReRAM module. The second electrode comprises a second surface area, a plasma interacting component, and a resistive component located between the plasma-interacting component and the ReRAM module. A ratio of the first surface area to the second surface area creates a voltage between the first electrode and second electrode when the first surface area and second surface area are exposed to an application of plasma. The voltage forms a conductive filament in the ReRAM module.

Some embodiments of the present disclosure can also be illustrated as a memory structure that comprises a ReRAM module with a first and second end. The memory structure also comprises a substrate. The memory structure also comprises a recess in the insulative layer. The recess exhibits an outline of a shape of a first antenna electrode and an outline of a shape of a second antenna electrode.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1A:
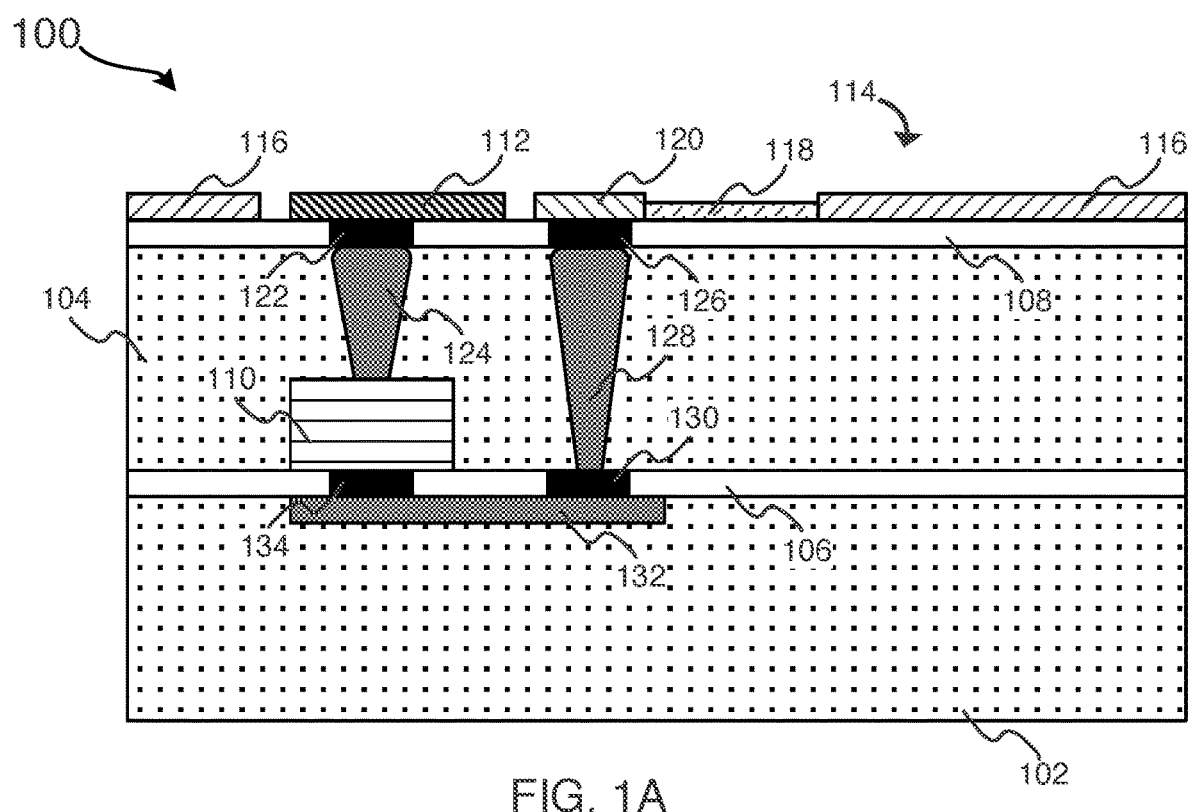
FIG. 1A depicts a first side view of an antenna structure that can be used for forming a conductive filament in a ReRAM module, in accordance with embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to memory modules, and more specifically, to forming ReRAM modules. While the present disclosure is not necessarily limited to such applications, various aspects of the disclosure may be appreciated through a discussion of various examples using this context.

Random access memory (referred to herein as "RAM") is a form of computer storage in which information can be stored for fast retrieval by another computer component, such as a processor. RAM, for example, is found in the cache memory of many processors and is used as the main memory in many computer systems. The structure of RAM and process by which RAM stores information varies based on the form of RAM used. For example, RAM used in processor cache sometimes the form of a six-transistor memory cell, whereas RAM used in system memory sometimes takes the form of a transistor-capacitor cell. In typical RAM formats, a cell can store one bit of information, and the state of the cell (e.g., charged or not charged) can be used to set the bit on or off (also referred to as setting the bit to "true" or "false," to "1" or "0," and some others).

In resistive RAM (referred to herein as "ReRAM") for example, a memory cell takes the form of a dielectric solid state material, sometimes referred to as a "memrister." For example, a ReRAM module sometimes takes the form of an oxide layer that is placed between two electrodes in a memory stack. While typically nonconductive, allowing oxide defects to form in this oxide layer can cause the resistance of the material to change, becoming electrically conductive. These oxide defects are sometimes referred to as "oxygen vacancies," and describe locations of oxide bonds at which the oxygen has been removed (typically migrated to other portions of the oxide layer). Once these defects are formed in a continuous path (sometimes referred to as a "filament") between two ends of the memrister, the electrical resistance between those two ends can drop significantly. Further, when an electric field of a particular voltage is subsequently applied to the memrister, the oxygen that was previously removed from the oxide-bond locations (i.e., the oxygen vacancy location) can migrate back to the oxide-bond locations. When this happens, the "filament" is deformed, and the electrical resistances between those two ends of the memrister increase significantly again. This process is reversible. Thus, by applying electrical fields of particular voltages to the memrister, the memrister can be switched between a state of high resistance and a state of low resistance.

Thus, in ReRAM, an electrical charge can be applied to the memory module in order to switch the electrical resistance of the module between a first resistance value (sometimes referred to as "high resistance" and a second resistance value (sometimes referred to as "low resistance"). The state of the module can be taken advantage of to store information. For example, by setting each state to either a 1 or 0 (for example, setting the high-resistance state to "1" and the low-resistance stage to "0"), the state of that memrister can be used to store one bit of information.

Unlike some other types of RAM, ReRAM is considered non-volatile, meaning that it does not lose its stored information when it is not powered. In other words, the state of ReRAM (high resistance or low resistance) is stable when power is shut off from the computer system. For this reason, ReRAM has potential benefits in longer-term storage, such as a replacement (or supplement) to hard disk drives and solid state drives. If successfully applied in long-term storage, ReRAM could offer significant storage boosts to computer systems due to ReRAM's low read latency and high write speed as compared with other long-term storage solutions.

However, difficulties in forming ReRAM can make utilizing ReRAM in storage systems difficult, if not completely unfeasible. For example, as discussed, in order for ReRAM to be formed, a sufficient voltage must be applied across the ReRAM module to form a continuous path of oxide defects (i.e., a conductive filament). This "sufficient voltage" is sometimes referred to as a formation voltage.

Unfortunately, the formation voltage for a typical ReRAM module is often significantly higher than the voltage that is necessary to switch the ReRAM between resistance states after the conductive filament is formed. For example, a typical ReRAM module may be designed to operate at similar voltages as other memory systems (e.g., 1.2 volts). However, forming the conductive filament in such a ReRAM module may require over 4 volts (i.e., the formation voltage) to be applied to the ReRAM module. Further, applying this formation voltage typically requires applying the voltage through the same pathways as the voltage by which the ReRAM is switched between states when used in a system (for example, through a bit line and word line). In other words, the formation voltage must, in some applications, be applied through the final circuit design of the ReRAM module and the associated connections to the system.

Unfortunately, applying a formation voltage (e.g., 4V) through a circuit that is only designed to handle a memory switching voltage (e.g., 1.2V) can cause damage to the circuit. For example, in a typical complementary metal oxide semiconductor (sometimes referred to as "CMOS") system, applying a voltage that is significantly higher than the voltage for which the circuit is designed could cause a short to form between the gate and the conducting channel, or across the conducting channel between the source and the drain. In cutting-edge systems with very small components, high voltage can also damage contacts and wires. Thus, incorporating ReRAM modules in memory circuits often requires efforts be made to mitigate those ill effects.

For example, one method to mitigate the potential damage caused by high voltage includes designing the memory circuits more robustly. This typically includes, for example, including thicker wires, thicker isolating layers, and wider gate pitches. In other words, the components of the memory circuit may be made larger. Unfortunately, most contemporary systems attempt to utilize small, narrow-gate circuits due to their performance benefits and the increased component density they afford. For this reason, using larger circuits in high-performance devices is often very undesirable, and the benefits of ReRAM may be offset by the detriments of designing circuits that are large and robust enough to withstand the formation voltage of the ReRAM.

Another method of mitigating potential damage from formation voltage involves including an "oxygen vacancy" reservoir in the ReRAM module near the intended conductive filament. Such a reservoir can create a strong diffusion force, causing oxygen vacancies to quickly flow into the location of the conductive filament when the formation voltage is applied. In other words, a reservoir of oxygen vacancies (i.e., locations of oxide bonds in which the oxygen has been removed) can cause the oxygen at the intended location of the conductive filament to quickly diffuse to the reservoir when a voltage is applied. Unfortunately, this method can result in a filament formation that is hard to control, which can lead to several disadvantages.

To begin, the reservoir can cause the channel to form so quickly that the resistance of the conductive filament can become extremely low, increasing the voltage required to "close" the filament when the ReRAM is used. In other words, the conductive filament can form quickly enough and wide enough that switching the state of the ReRAM in normal operation can require a very high voltage. In some instances, the conductive filament can be formed wide enough that the switching voltage is high enough to damage other components of the system. This may not only make the ReRAM unusable in normal systems, but also can defeat the purpose of the oxygen-vacancy reservoir.

Further, even if the filament is formed correctly, the oxygen-vacancy reservoir typically remains in place after formation. Thus, the diffusion force that decreases the effort required to form the conductive filament is often still present during normal operation of the ReRAM module. As a result, applying a switching voltage to the ReRAM to change the state of the memory can cause new defects can form in the conductive filament due to more oxygen diffusing into to the oxygen-vacancy reservoir than when the conductive filament was originally formed. In other words, the presence of the oxygen-vacancy reservoir can cause the conductive filament in the ReRAM to widen during operation of the memory. This can be caused by normal operation of the ReRAM, but can be significantly exacerbated if a voltage that is slightly greater that the ReRAM's switching voltage is accidentally applied. For example, if the ReRAM's switching voltage is 1.2V, applying a voltage of 1.200V may cause the conductive filament to widen slightly. However, accidentally applying 1.21V (for example, due to power-source variations) may cause the conductive filament to widen more significantly. Thus, the presence of the oxygen vacancy not only can cause the ReRAM module to fail after repeated uses, but also makes the ReRAM module sensitive to high voltages.

Unfortunately, as the conductive filament widens, the filament also becomes more sensitive to the current that carries the switching voltage. As a result, as the conductive filament widens, it becomes more likely to widen again when the switching voltage is applied again. This can result in a feedback loop, causing the filament to widen at a faster and faster rate as the ReRAM is used, eventually widening so far that switching the ReRAM requires a voltage high enough to damage the circuit.

For these reasons, a mechanism is desired by which a formation voltage can be applied to a ReRAM module without relying on circuit components that are more robust (i.e., larger) than necessary for the operation of the circuit and without relying on an oxygen-vacancy reservoir to lower the switching voltage.

To address the above issues, some embodiments of the present disclosure utilize an antenna system to form a conductive filament in a ReRAM module during formation of a RAM stack, rather than after formation. In some embodiments, the voltage applied through the antenna can be higher than the voltage the remainder of the circuit is designed to carry, allowing a high formation voltage to be applied to the ReRAM module without risking damage to the remainder of the circuit. In some embodiments, the antenna system can be removed after formation of the conductive filament, preventing lasting effects of the antenna from affecting the ReRAM module during normal operation.

In some embodiments, for example, two electrodes are formed on an insulative layer on a substrate in which (or beneath which) the ReRAM module is embedded. Each electrode may be electrically connected to an opposite end of the ReRAM module. The two electrode may differ in size on the surface of the insulative layer, causing an unequal surface area of the electrodes to be exposed when viewing the structure from above. In some embodiments, these electrodes may be exposed to an application of plasma from above. As a result, more of one electrode than the other electrode may be exposed to that plasma, causing a voltage to form between the two electrodes. Because each electrode is connected to an opposite end of the ReRAM module, this voltage may cause a current to pass through the ReRAM module at that voltage and between the two ends, which may in turn cause oxygen in oxide bonds to migrate away from the path of that voltage. In other words, oxygen-vacancy defects may be formed across the ReRAM module, causing a conductive filament.

Unfortunately, current created due to the application of plasma may be difficult to control. Unlike current created electronically, the current created by the plasma hitting the two electrodes would not naturally be limited. At the beginning of the process, the high resistance of the ReRAM module may result in a very small current flowing between the electrodes. However, as defects build in the ReRAM module, the resistance decreases, causing a higher current to flow at that created voltage. This higher current causes oxygen-vacancy defects to be created faster, causing the resistance of the ReRAM module to increase at a faster rate as well. Thus, the uncontrolled current created by the application of plasma can result in a positive feedback loop, which can quickly cause the current in the ReRAM module to be so high that the conductive filament becomes undesirably large.

For this reason, some embodiments of the present disclosure include a resistive component in the design of the electrodes that interact with the plasma application. For example, in some embodiments of the present disclosure, a first electrode is designed with larger surface area than the second electrode, which can cause a current to flow from the first electrode to the second electrode. In some embodiments, the second electrode includes a plasma-interacting component and a resistive component. In these embodiments, the resistive component may be located between the ReRAM module and the plasma-interacting component, such that the current created by the application of the plasma on the plasma-interacting component passes through the resistive component. Further, because the ratios of surface areas between the first and second electrode can be kept constant during the application of plasma, the voltage created during the application can be kept constant if the intensity of plasma application is kept constant. Thus, the voltage of the current and the resistance of the resistive component can be kept constant, which may therefore limit the current that passes to the ReRAM module to a maximum value. If this maximum value is sufficiently low, a positive feedback loop during the formation of the conductive filament can be prevented.

In some embodiments, the resistive component may take the form of a thin, winding portion of the electrode. For example, the resistive component may resemble a metal wire (e.g., a strip-line wire) that follows a circuitous path on the surface of the insulative layer between the plasma-interacting component of the electrode and a contact that connects the electrode to the interior of the substrate. In some embodiments, this contact may be formed on the surface of the substrate and may be considered a part of the electrode, and in other embodiments the contact may be formed prior to the electrode. For example, the contact may be embedded in an oxide layer on which the electrode is formed, or may take the form of a conductive via plug that connects the electrode to the interior of the substrate.

In some embodiments, the dimensions of the resistive component may be manipulated to result in a desired resistance value. For example, the length of the resistive component may be increased to increase the resistance of the component. In other words, increasing the amount of the resistive component that the current needs to flow through may increase the resistance of the resistive component. This may be analogous to making a wire longer. Similarly, decreasing the average (or minimum) width of the resistive component throughout that length may also increase the resistance of the resistive component. This may be analogous to making a wire thinner. Finally, decreasing the height of the resistive component (i.e., the distance between the insulative layer and the top of the resistive component) may also increase the resistance of the resistive component. This may also be analogous to making a wire thinner. These three dimensions can be changed in order to tune the resistance of the resistive component while also attempting to prevent the surface area of the insulative layer required for the resistive component from negatively restricting the surface area available for the first and second electrode.

In some embodiments, manipulating the dimensions of the resistive component as described may result in the resistive component taking the form of a circuitous line between the plasma-interacting component and the contact that connects the electrode to the interior of the substrate. For example, the resistive component may take a serpentine shape that proceeds back and forth on the surface of the substrate, a jazzed, "zig-zag" shape, a spiral shape, a curved line, or others. In most embodiments, the precise shape of the resistive component may not be vital, provided that the dimensions of the resistive component result in the desired resistance value.

In some embodiments, the two electrodes of the antenna may be removed from the insulative layer once the conductive filament is formed. For example, a chemical etching process can be used to remove the metal (or metals) of the two electrodes without removing the surface of the insulative layer. Once those electrodes are removed, the remainder of the RAM structure can be built (including, for example, adding substrate layers and electrical connections between the ReRAM module and the bitline and wordline). By removing the antenna before completing the RAM structure, any negative effects the antenna structure may have caused on the completed structure (e.g., capacitive effects) may be avoided. For this reason, embodiments of the present disclosure may include incorporating an antenna structure that is as large and as complex as necessary to create the conductive filament without concern that the antenna structure may negatively impact the memory module after formation.

FIG. 1A depicts a first side view of an antenna structure that can be used for forming a conductive filament in a ReRAM module, in accordance with embodiments of the present disclosure. FIG. 1A depicts a view of a memory structure 100 (e.g., a RAM stack) during the construction of the structure, and may be before all layers of the structure have been added.

Memory structure 100 contains two substrate layers, layer 102 and 104. Substrate layers 102 and 104 may be composed, for example, of an insulative material such as a fiberglass-resin mixture. Substrate layer 102 is separated from substrate layer 104 with insulative layer 106, in which electrical contacts between the two layers may be embedded. Substrate 104 includes insulative layer 108, formed on top of substrate 104. Like insulative layer 106, insulative layer 108 may include electrical contacts embedded therein. Insulative layers 106 and 108 may, for example, take the form of silicon dioxide layers.

Memory structure 100 also includes ReRAM module 110. ReRAM module 110 may take the form of a memrister, for example, such as an oxide layer embedded into substrate 104. Thus, before the formation of oxide-vacancy defects in ReRAM module 110, ReRAM module 110 may be highly resistive to electric current.

Memory structure also includes electrode 112 and 114, which are electrically connected to ReRAM module 110. Electrode 112 contains a single component. Electrode 114, on the other hand, contains, as illustrated, three components: plasma-interacting component 116, resistive component 118, and contact component 120. In some embodiments, electrode 112 and all components of electrode 114 may be composed of the same metal material, and may have been formed by etching away a pattern from a single sheet of that metal material. Further, while plasma-interacting component 116 is illustrated in FIG. 1A as containing two parts, these are actually two regions of the same component which appear separate in FIG. 1A due to the cross-section nature of FIG. 1A. This will be presented more clearly in FIG. 1B.

Electrode 112 is proximately connected to the upper end of ReRAM module 110, as illustrated. As used herein, the term "proximately connected" describes a connection between two components in relation the remainder of one of those components. For example, electrode 112 can be described as proximately connected to the top end of ReRAM module 110 as compared to the lower end of ReRAM module 110 because electrode 112 is connected more directly to the upper end of ReRAM module 110 than the lower end. Thus, even though electrode 112 may have an electrical connection to both the upper and lower ends of ReRAM module 110 (particularly after the formation of a conductive filament), electrode 112 is electrically connected to the upper end more directly than the lower end. By this reasoning, therefore, Electrode 114 is proximately connected to the lower end of ReRAM module 110, as illustrated.

The connection between electrode 112 and ReRAM module 110 is through contact pad 122 and conductive plug 124. The connection between electrode 114 and ReRAM module 110 is through contact component 120, contact pad 126, conductive plug 128, contact pad 130, wire 132, and contact pad 134. It is of note that the specifics of these connections are not intended to be interpreted as limiting. Rather, in various embodiments and various implementations, these connection routes may include fewer components or more components, depending on the implementation circumstances. For example, while contact pad 130 is illustrated in memory structure 100, in some embodiments contact pad 130 could be omitted and conductive plug 128 could span the entire distance between contact pad 120 and wire 132.

Figure 1B:
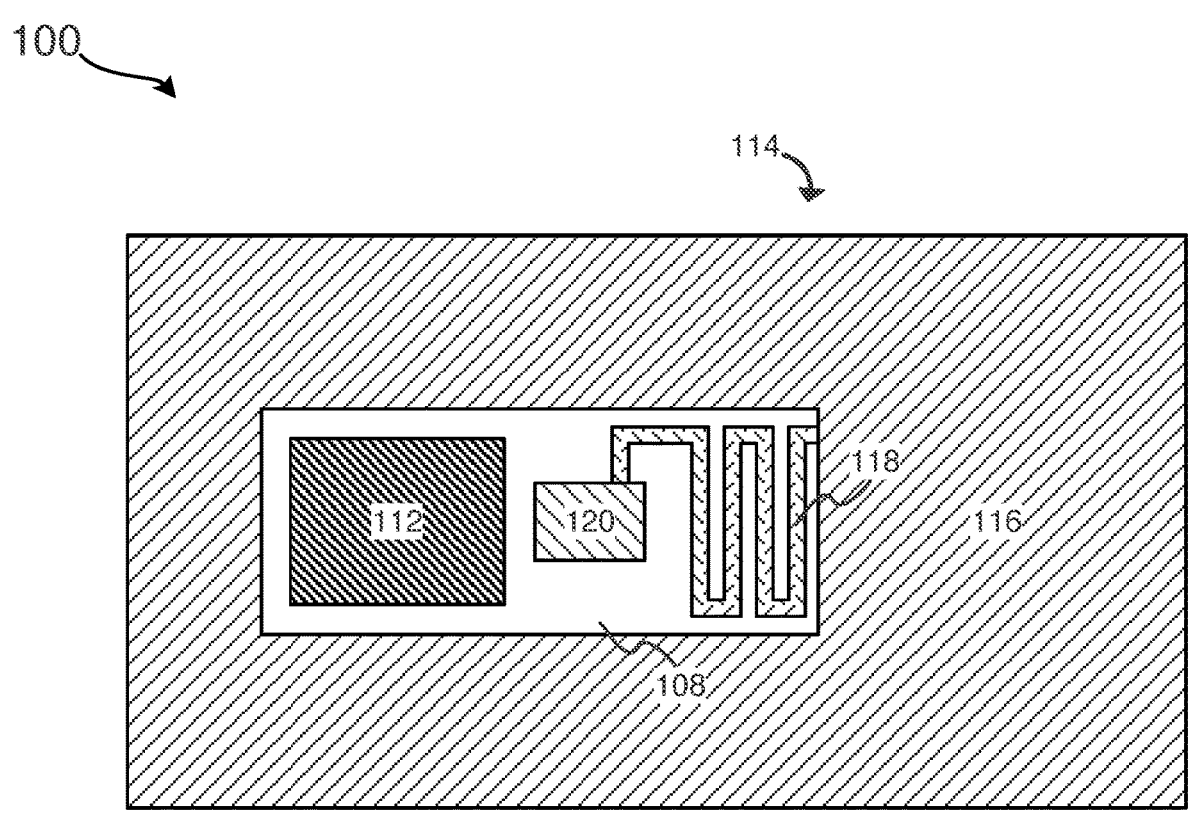
FIG. 1B depicts a top view of the antenna structure that can be used for forming a conductive filament in a ReRAM module, in accordance with embodiments of the present disclosure.

FIG. 1B depicts a top view of memory structure 100 and illustrates the antenna structure that can be used for forming a conductive filament in a ReRAM module, in accordance with embodiments of the present disclosure. As depicted in FIG. 1B, the electrode 112 comprises a surface area that is significantly less than the surface area comprised by electrode 114. Further, because electrode 112 and electrode 114 do not make contact on insulative layer 108, the electrical connection between electrodes 112 and 114 is through the connective components embedded within and beneath insulative layer 108 (including ReRAM 110). For these reasons, when both electrode 112 and electrode 114 are exposed to an application of plasma from "above," a current may flow from electrode 114 to electrode 112 through those connective components. The voltage of this current may be largely determined by the ratio between the surface areas of electrodes 112 and 114 that are exposed to that application of plasma.

As such, electrodes 112 and 114 are designed with different surface areas. Specifically, the electrode 114 comprises a surface area that is significantly greater than the surface area of electrode 112. Further, while resistive component 118 and contact component 120 do contribute to the surface area of electrode 114, most of the surface area comprised by electrode 114 is found in plasma-interacting component 116. As such, the ratio of electrode 112's surface area and electrode 114's surface area is largely affected by the relative sizes of electrodes 112 and plasma-interacting component 116. Thus, the effect of plasma application on plasma-interacting component 116 contributes significantly more to creation of voltage between electrodes 112 and 114 than the effect of plasma application on resistive component 118 and contact component 120. For this reason, plasma-interacting component 116 is specifically referred to as "plasma interacting," even though resistive component 118 and contact component 120 also interact with the application of plasma.

As discussed previously, the current that flows between electrodes 112 and 114 may, unlike current that originates from an electrical power source, be difficult to control. For this reason, resistive component 118 is located between plasma-interacting component 116 and ReRAM module 110. Resistive component 118 may take the form of a circuitous line (similar to a serpentine wire) between plasma-interacting component 116 and contact component 120. As a result, the current that flows from plasma-interacting component 116 to ReRAM module 110 will be limited by the resistance of resistive component 118. Thus, in embodiments in which the majority of the current that flows through ReRAM module 110 originates in plasma-interacting component 116 (i.e., embodiments in which plasma-interacting component 116 is significantly larger than resistive component 118, contact component 120, and electrode 112), resistive component 118 can be used to set a maximum value for the current that reaches ReRAM module 110. For this reason, some embodiments of the present disclosure may attempt to minimize the surface area of resistive component 118 and contact component 120 as compared to plasma-interacting component 116. This may prevent a positive feedback loop from occurring during the formation of a conductive filament within ReRAM module 110.

Figure 1C:
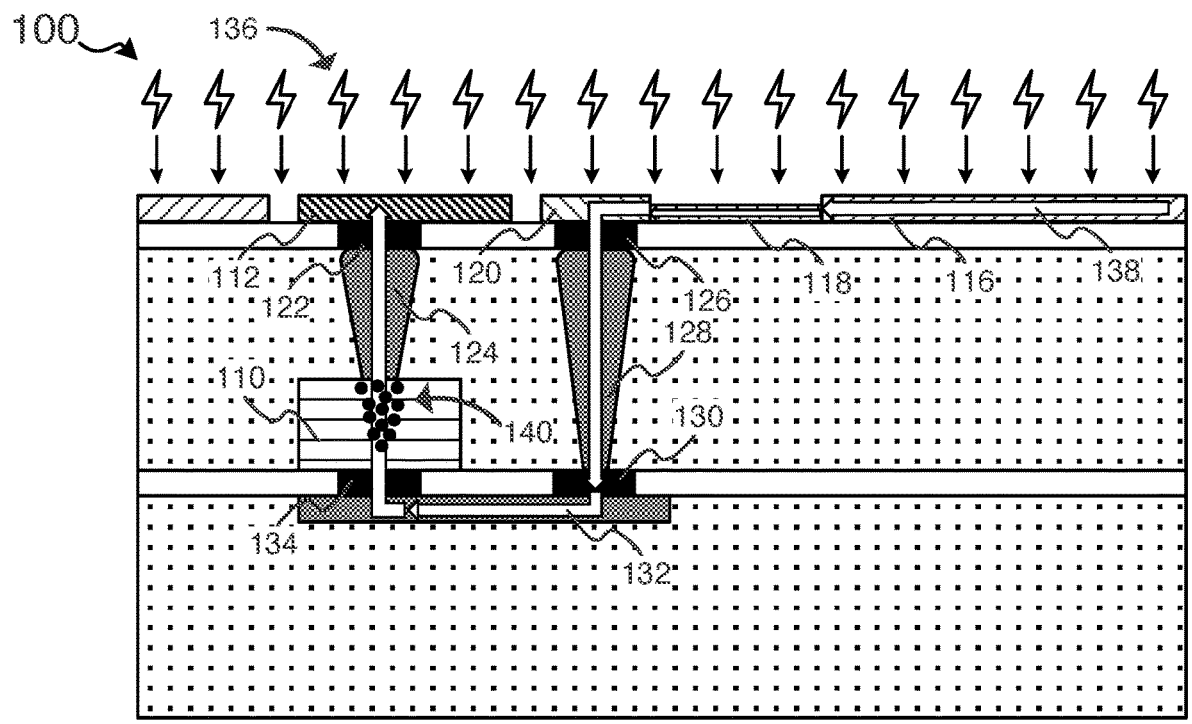
FIG. 1C depicts a second side view of the antenna structure during formation of a conductive filament in a ReRAM module, in accordance with embodiments of the present disclosure.

FIG. 1C depicts a second side view of memory structure 100 during formation of a conductive filament in ReRAM module 110, in accordance with embodiments of the present disclosure. In FIG. 1C, the top surface of memory structure 100 is being exposed to an application of plasma 136. Plasma 136 is hitting electrodes 112 and 114, causing a current to flow between the two electrodes at a particular voltage. This current is illustrated by flow lines 138, which span from plasma-interacting component 116 to electrode 112. The voltage of this current may be determined by the intensity of plasma 136 and by the ratio of the surface area of electrode 114 that is exposed to the plasma to the surface area of electrode 112 that is exposed to the plasma. Specifically, as the intensity of the plasma increases, the voltage tends to increase. Similarly, as the ratio of the surface area of electrode 114 and the surface area of electrode 112 increases, the voltage increases. The current that is created by the exposure to plasma 136, however, may be limited by resistive component 118. Specifically, the current may be approximately the voltage of the current divided by the resistance of resistive component 118.

In some instances, the desired resistance value of ReRAM module 110 when the conductive filament is formed (i.e., the low-resistance state) may be known prior to filament formation. For example, experimental testing may suggest that a ReRAM module of a particular resistance is able to be easily switched by applying an electric field, but that a ReRAM module with a resistance that is lower than the particular resistance may be difficult or impossible to switch. In these instances, this desired resistance value (sometimes referred to as a "target resistance value") may be used as a standard by which to set the resistance of resistive component 118. In other words, resistive component 118 could be designed to comprise a resistance of at least that target resistance value. If the resistance value of resistive component 118 is above that target resistance value, the current that flows through ReRAM module 110 should be small enough that the resistance of ReRAM module 110 is greater than or equal to the target resistance value. For this reason, some embodiments may include designing resistive component 118 with dimensions that cause it to comprise a resistance that is at least as large as the target resistive value at the voltage created by application of plasma 136.

FIG. 1C also discloses the partial formation of a conductive filament in ReRAM module 110 through oxygen-vacancy defects 140. As illustrated, oxygen-vacancy defects 140 do not yet span the entire distance between the top end of ReRAM module 110 and the bottom end of ReRAM module 110. However, provided that the application of plasma 136 is continued, oxygen-vacancy defects 140 should continue to spread in ReRAM module 110 in the path of flow line 138 until the resistance of ReRAM module 110 through the conductive filament is approximately equal to the resistance of resistive component 118.

Figure 1D:
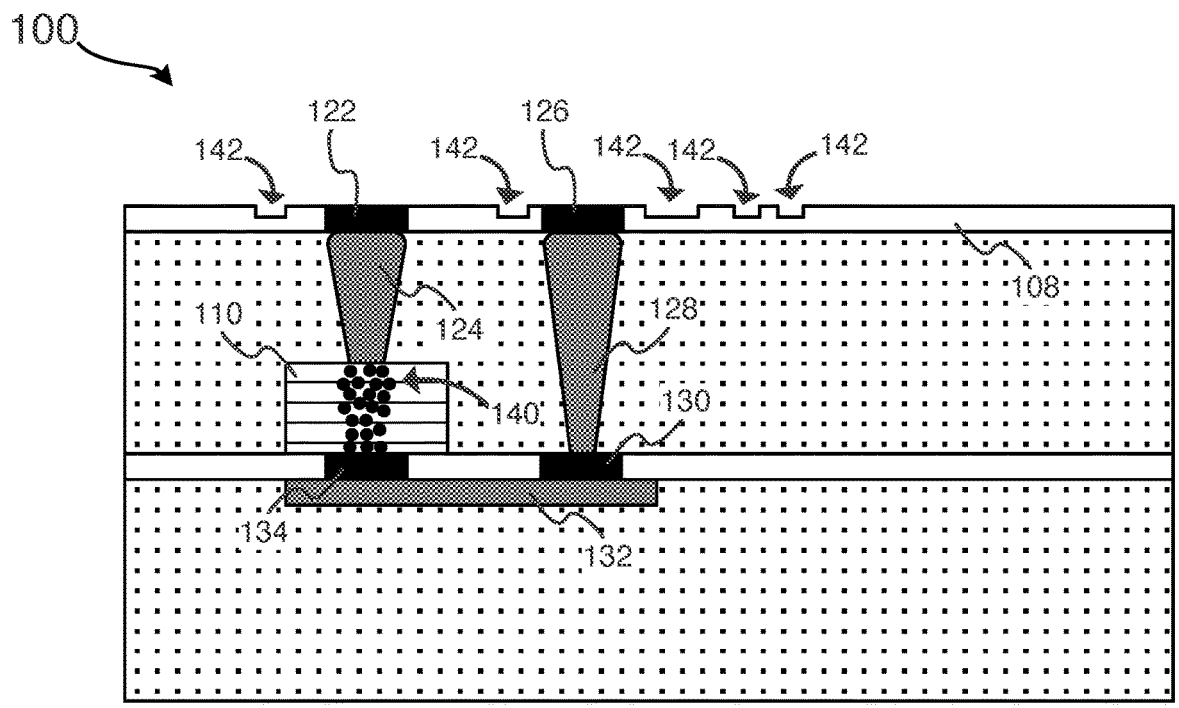
FIG. 1D depicts a third side view of the antenna structure after formation of a conductive filament in the ReRAM module and removal of the antenna electrodes, in accordance with embodiments of the present disclosure.

FIG. 1D depicts a third side view of memory structure 100 after formation of a conductive filament in ReRAM module 110 and removal of antenna electrodes 112 and 114, in accordance with embodiments of the present disclosure. As illustrated, oxygen-vacancy defects 140 now span the entire distance between the top end and bottom end of ReRAM module 110. Further, the width of the area covered by oxygen-vacancy defects 140 and the concentration of defects within that area are high enough that the resistance of ReRAM module 110 in its current state has reached the target resistance value (i.e., a value at which switching ReRAM module 110 between a high and low resistance state is feasible).

Once the resistance of ReRAM module 110 reached this state, the resistance of ReRAM module 110 and the resistance of resistive component 118 may have been approximately equal, causing limited further growth in the conductive filament (i.e., limited new oxygen-vacancy defects). Thus, the application of plasma may have been terminated at that point.

While electrodes 112 and 114 have been removed in FIG. 1D, contact pads 122 and 126 are illustrated as still embedded within insulative layer 108. Contact pads 122 and 126 may be unnecessary for the formation or operation of memory structure 100 after the formation of the conductive filament within ReRAM module 110. However, because retaining contact pads 122 and 126 within memory structure 100 is unlikely to significantly affect the operation of memory structure 100 once it is completely formed, contact pads 122 and 126 may be retained in some embodiments. Further, because contact 122 is proximately connected to the top end of ReRAM module 110 with respect to the bottom end, because the contact 126 is proximately connected to the bottom end of ReRAM module 110 with respect to the top end, and because both contact 122 and contact 126 are embedded within the same insulative layer 108, the unusual "U" shaped design between contact 122, conductive plug 124, ReRAM module 110, contact pad 134, wire 132, contact pad 130, conductive plug 128, and contact 126 may also be retained in the final formation of memory structures 100.

Further, because some areas of insulative layer 108 were not covered by electrodes 112 and 114 during the application of plasma 136 and the etching of electrodes 112 and 114, these areas of insulative layer 108 were exposed to plasma 136 and etching as well. One or both of these exposures may cause damage or erosion of insulative layer 108. As a result, insulative layer 108 now contains a recess in those areas. In FIG. 1D, this is illustrated by recess location 142. While these appear to be multiple recesses, as will be illustrated in FIG. 1E, they are actually all locations on the same recess. Because this recess results from the portions of insulative layer 108 that are not covered by electrode 112 and electrode 114, recess 142 exhibits an outline of the shape of the first electrode and an outline of the shape of the second electrode. Indeed, by comparing FIGS. 1D and 1C, it becomes clear that recess 142 occurs (as illustrated) in gaps between electrode 112 and electrode 114, as well as the location of resistive component 118.

Figure 1E:
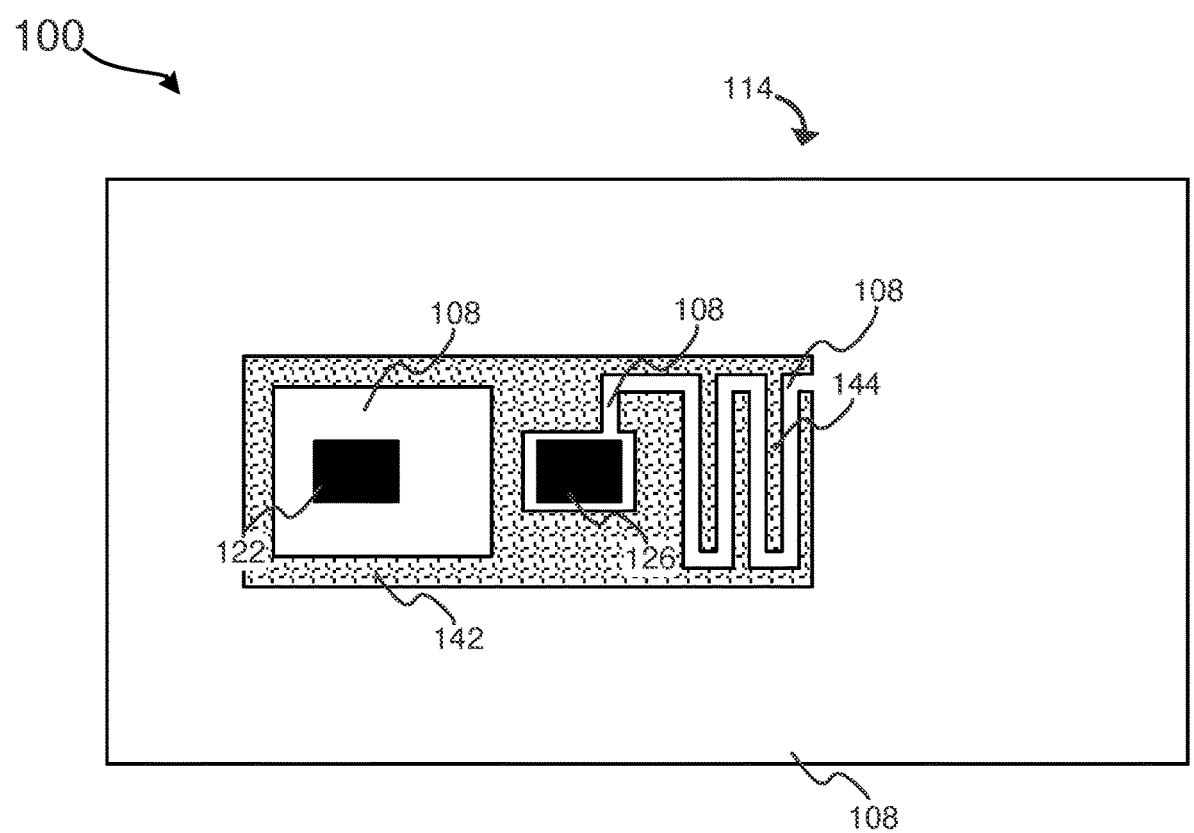
FIG. 1E depicts a top view of the memory structure after removal of the antenna electrodes, in accordance with embodiments of the present disclosure.

FIG. 1E depicts a top view of memory structure 100 after removal of the antenna electrodes. FIG. 1E illustrates, therefore, the entire recess 142 in insulative layer 108 that could result from one or more of the exposure to the application of plasma 136 in FIG. 1C and the exposure to the etching process between FIGS. 1C and 1D. As can be seen by comparing FIG. 1E to FIG. 1B, portions of insulative layer 108 that were covered by electrode 112 and electrode 114 have not been exposed, and are not recessed. However, the portions of insulative layer 108 that were visible in FIGS. 1A through 1C were exposed are now illustrated as recess 142 in FIG. 1E. As such, recess 142 exhibits an outline of the shape of electrode 112 and electrode 114. Of note, the outline of the shape of electrode 114 includes the outline of the shape resistive component 118, illustrated here as outline 144. Outline 144 shows the shape of resistive component 118 prior to being etched. Outline 144 takes the form of an outline of a circuitous line between the majority of the non-recessed portion of insulative layer 108 and contact 126. As illustrated, this circuitous line moves back and forth across the recess, though other patterns of circuitous lines are possible and consistent with the embodiments of this disclosure.

FIG. 1E also illustrates a top view of contacts 122 and 126 embedded within the portions of insulative layer 108 that were covered by electrodes 112 and 114. It is of note that, like contacts 122 and 126, recess 142 is unlikely to significantly affect the operation of memory structure 100 after it is completely formed. For that reason, recess 142 may be retained within insulative layer 108 in the final form of memory structure 100.

Once the resistance of the ReRAM module has reached the target resistance value, the ReRAM module may be to be implemented in a functioning memory structure. This may include, for example, connecting the first end of the ReRAM module to a memory-cell transistor.

As illustrated in FIG. 1D, electrodes 112 and 114 have been etched off oxide layer 104. This may have been performed through a chemical etching process. As a result, memory structure 100 could be incorporated into a larger memory structure without concern that electrodes 112 and 114 may cause capacitance issues within memory structure 100. This may be beneficial in avoiding signal degradation and overshoot due to the capacitance of the electrodes. Thus, while removing electrodes 112 and 114 may be an extra process that requires time and money and may introduce potential errors, removing the electrodes may be beneficial overall.

Figure 2:
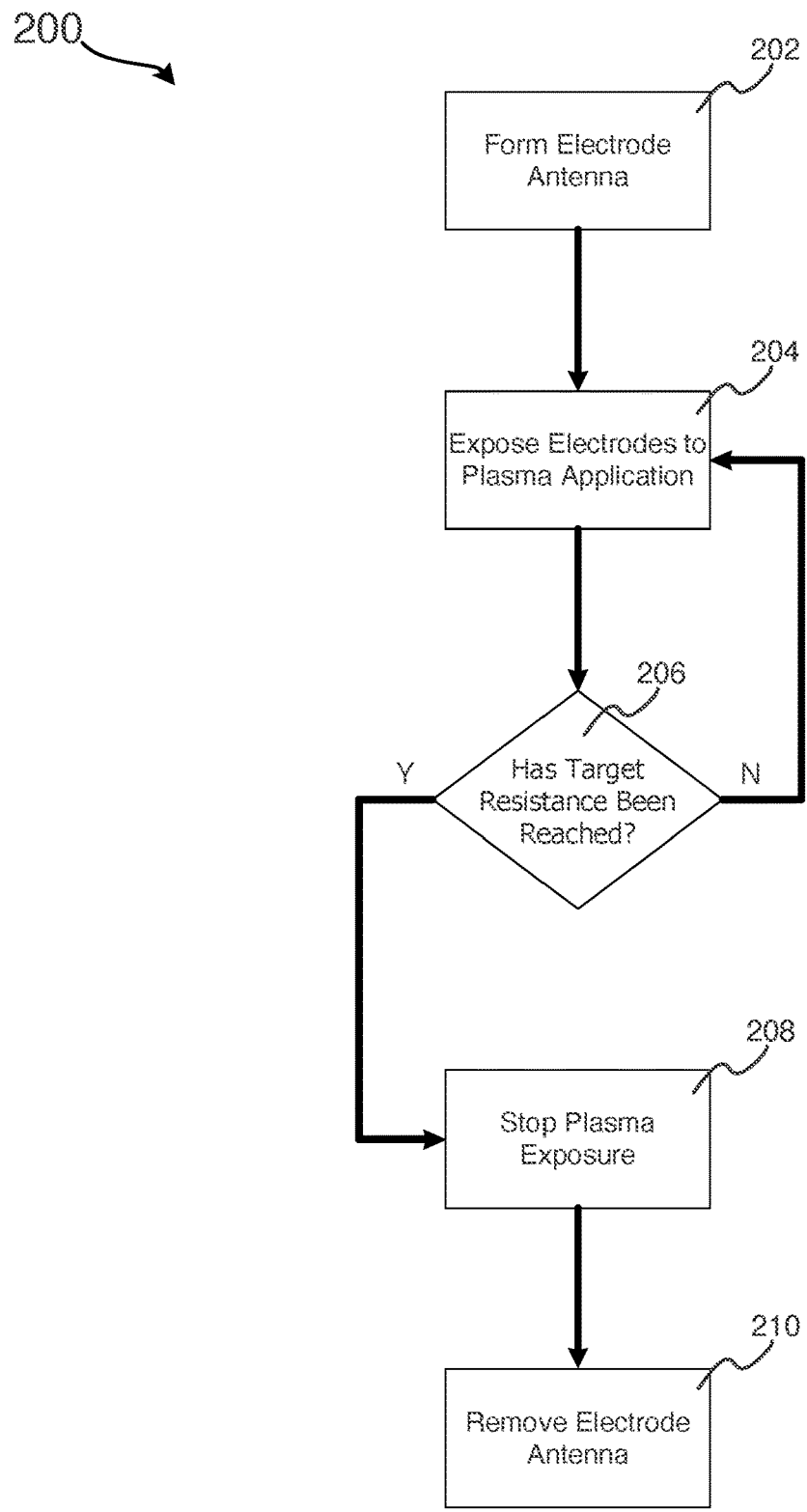
FIG. 2 depicts a method of using an antenna structure to form a conductive filament in a ReRAM module in accordance with embodiments of the present disclosure.

FIG. 2 depicts a method 200 of using an antenna structure to form a conductive filament in a ReRAM module in accordance with embodiments of the present disclosure. An understanding of method 200 may be useful in understanding the embodiments disclosed with respect to FIGS. 1A-1D.

Method 200 begins in block 202 in which an electrode antenna is formed. In some embodiments, for example, this may include attaching a metal foil to the surface of a substrate (or stack of substrates) or insulative layer placed thereon and etching away the metal not covered by a protective layer. The remaining layer of metal after etching may include a first electrode that connects proximally to a first end of the ReRAM module and had a second electrode that proximally connects to a second end of the ReRAM module. One of the electrodes may also contain a resistive component that may take the form of a winding metal wire between the majority of the electrode and the ReRAM module. This resistive component may also be formed during the etching process.

In block 204, the electrodes are exposed to an application of plasma. In some embodiments the application of plasma may create a current that flows between the two electrodes and through an internal ReRAM module. The voltage of the current may be dependent upon the intensity of the plasma application and the relative surface areas of the two electrodes. The current itself may be limited by the resistive component on one of the electrodes, preventing a positive feedback loop while the conductive filament is being formed.

In block 206, a system overseeing method 200 determines whether the target resistance for the ReRAM module has been reached. This could happen in several ways, but may include testing the current flowing through the ReRAM module. If the system determines that the resistance of the ReRAM module is too low, the system may return to block 204. If, however, the system determines that the ReRAM module has reached the target resistance, the system may stop the plasma application in block 208. At this point, a conductive filament should be formed between a first end and a second end of a ReRAM module, and at a resistance that is conducive to switching the state of the ReRAM module (i.e., from high resistance to low resistance).

Once the plasma application is stopped in block 208, the electrode antenna is removed in block 210. In some instances, the removal of the electrode antenna prevents unwanted capacitive effects in the memory structure once it is completed. However, block 210 represents an added process that may not be necessary or beneficial in all instances, and thus in some implementations of method 200, block 210 may be omitted.

At this point, the ReRAM module may comprise a conductive filament that, in the low-resistance state, still exhibits a high-enough resistance to be easily switched between low-resistance and high resistance. Thus, the ReRAM module may be ready to be incorporated into a functioning memory structure. This could include, for example, connecting the end of the ReRAM module that contacted the first electrode with a memory-cell transistor in the memory structure.

Figure 3:
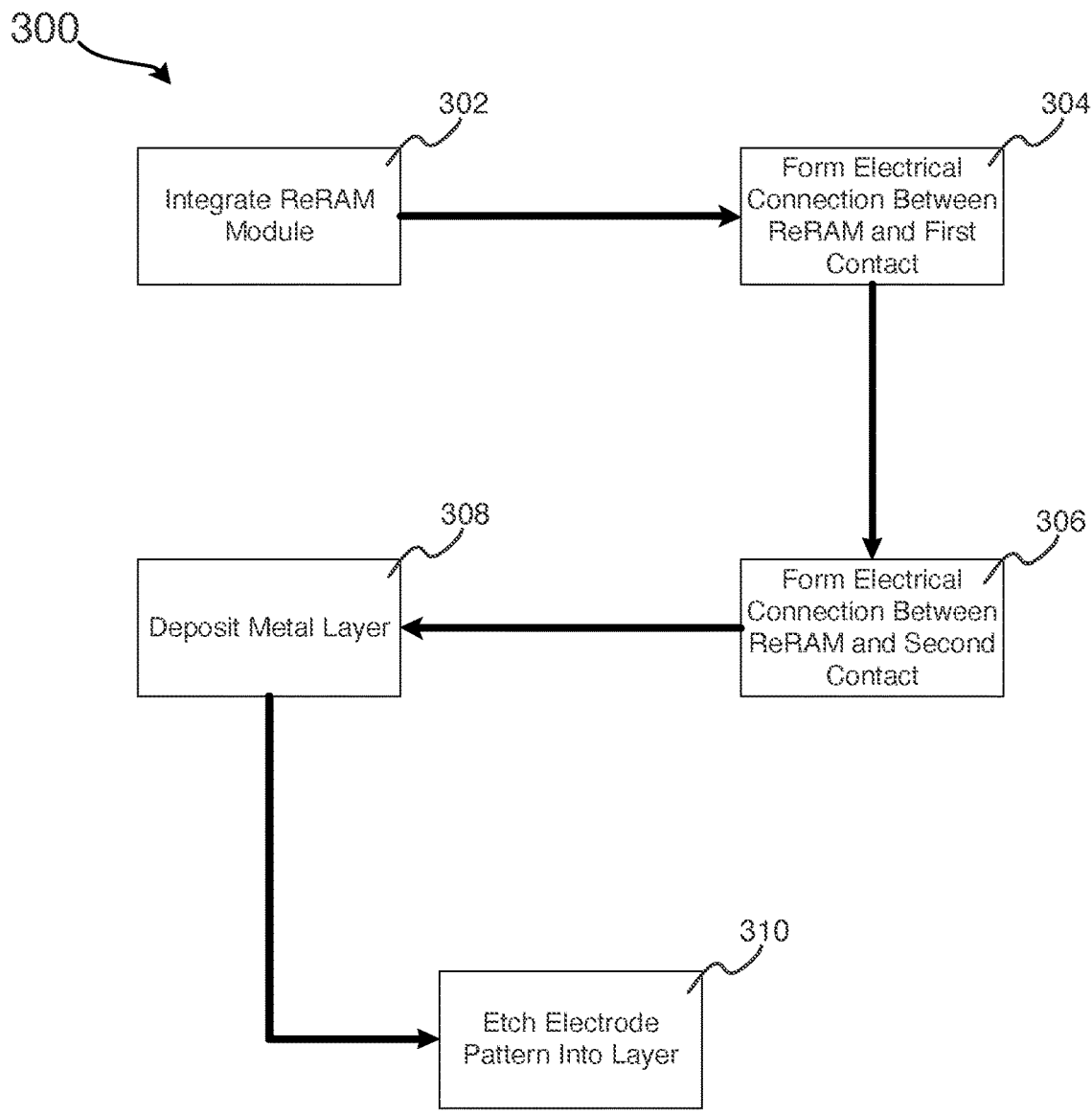
FIG. 3 depicts a method of forming an antenna structure that can be used to form a conductive filament in a ReRAM module in accordance with embodiments of the present disclosure.

FIG. 3 depicts a method 300 of forming an antenna structure that can be used to form a conductive filament in a ReRAM module in accordance with embodiments of the present disclosure. Method 300 begins in block 302 in which a ReRAM module is integrated into a memory structure (e.g., in a substrate of the memory structure). Method 300 also includes forming a connection between the ReRAM module and a first contact in block 304. In some embodiments, this first contact may be embedded within an insulating layer (e.g., an oxide layer) that is formed on top of the substrate in which the ReRAM module is integrated. In some embodiments, a via plug may span the distance within the substrate between the first contact and the ReRAM module. In some embodiments, the first contact may proximately connect with a first end of the ReRAM module.

Method 300 also includes forming an electrical connection between the ReRAM module and a second contact in block 306. Like the first contact, the second contact may be embedded within an insulating layer that is formed on top of the substrate. In some embodiments, a set of contacts, a wire, and a via plug may be used to form the electrical connection between the ReRAM and the second contact. In some embodiments, the second contact may proximately connect with a second end of the ReRAM module.

Once connections are made between the ReRAM module and the first and second contacts, a metal layer may be deposited, in block 308, on the insulating layer in which the first and second contacts are embedded. Therefore, the metal layer may make electrical connections with both the first and second contacts. At this point, the metal layer may be selectively etched in block 310 to form an electrode pattern that results in an antenna structure, such as the antenna structure illustrated in FIG. 1A-1D. In other words, a pattern may be etched out of the metal layer that results in a first electrode that makes an electrical connection with the first contact and a second electrode that makes an electrical connection with the second contact. In some embodiments, one electrode may be significantly larger than the other, creating a larger surface area. Thus, when the two electrodes are exposed to an application of plasma, a current of a particular voltage may be created.

In some embodiments, one of the electrodes may also comprise a resistive component. The resistive component may resemble a wire that circuitously connects the majority of the electrode to the respective contact. In these embodiments, the resistance of the resistive component may limit the current that is able to flow between the electrodes, which may also limit the current that is able to flow from one end of the ReRAM module to the other. In some embodiments, the dimensions of the resistive component may be designed to cause the resistance of the resistive component to be greater than or equal to the target resistance of the ReRAM module.

Figure 4A:
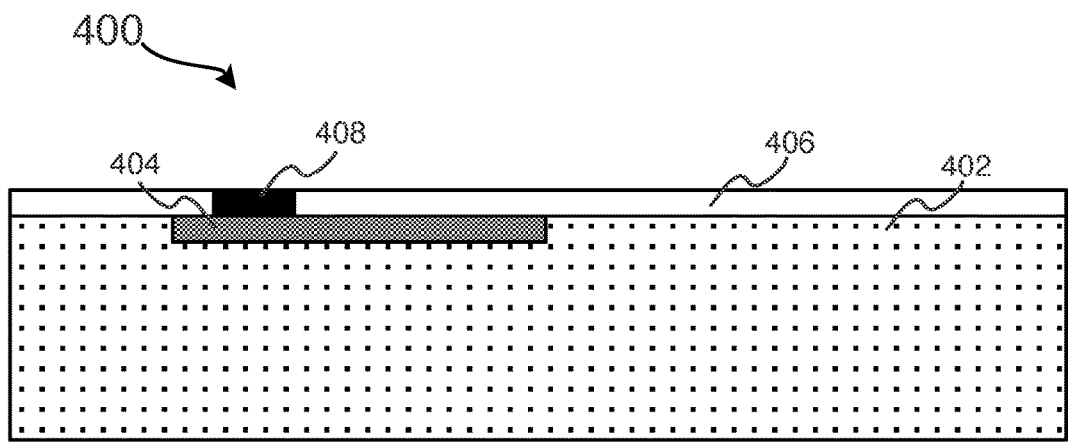
FIG. 4A depicts a side view of a first stage of forming an antenna structure that can be used to form a conductive filament in a ReRAM module in accordance with embodiments of the present disclosure.

To aid in understanding, FIG. 4A through 4E disclose the formation of an antenna structure in a memory structure 400. FIG. 4A, for example, depicts a side view of a first stage of forming an antenna structure that can be used to form a conductive filament in a ReRAM module in accordance with embodiments of the present disclosure. At this stage, memory structure 100 comprises first substrate layer 402 in which wire 404 has been embedded. An insulating layer 406 has been formed on top of substrate layer 402, and contact 408 has been embedded within that insulating layer such that contact 408 makes an electrical connection with wire 404.

Figure 4B:
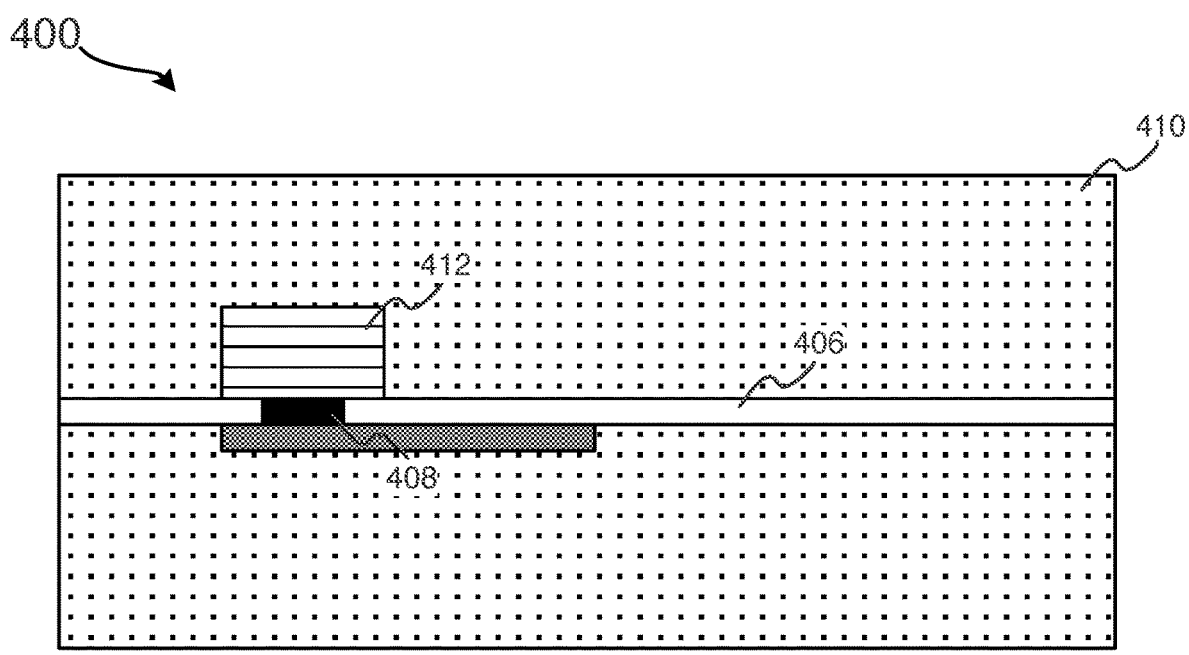
FIG. 4B depicts a side view of a second stage of forming an antenna structure that can be used to form a conductive filament in a ReRAM module in accordance with embodiments of the present disclosure.

FIG. 4B depicts a side view of a second stage of forming an antenna structure that can be used to form a conductive filament in a ReRAM module in accordance with embodiments of the present disclosure. In FIG. 4B, a second substrate layer 410 has been formed on top of insulating layer 406. Within substrate layer 410, a memristor 412 has been embedded such that memristor 412 forms an electrical connection with contact 408. Memristor 412 may take the form of a normally insulative component, such as an oxide layer.

Figure 4C:
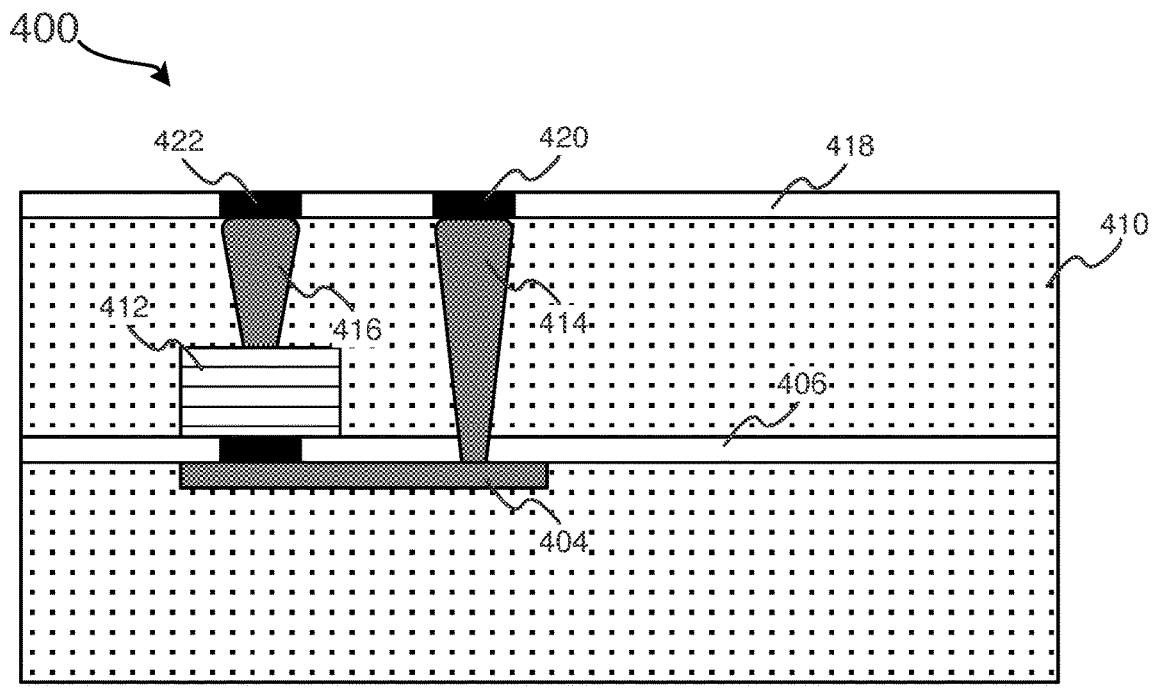
FIG. 4C depicts a side view of a third stage of forming an antenna structure that can be used to form a conductive filament in a ReRAM module in accordance with embodiments of the present disclosure.

FIG. 4C depicts a side view of a third stage of forming an antenna structure that can be used to form a conductive filament in a ReRAM module in accordance with embodiments of the present disclosure. In FIG. 4C, two vias have been drilled into substrate layer 410 and filled with conductive plugs 414 and 416. Conductive plug 414, as illustrated, extends from the top of substrate layer 410, through insulative layer 406, and to wire 404. As such, conductive plug 414 makes an electrical connection with wire 404. Conductive plug 416, on the other hand, extends from the top of substrate layer 410 to the top end of memristor 412. As such, conductive plug. 416 makes an electrical connection with memristor 412.

FIG. 4C also illustrates a second insulating layer 418 that has been formed on top of substrate layer 410. Insulating layer, for example, may take the form of a thin oxide layer. Contacts 420 and 422 have been embedded within insulative layer 418. Contact 420, for example, forms an electrical connection with conductive plug 414, whereas contact 422 forms an electrical connection with conductive plug 416.

Figure 4D:
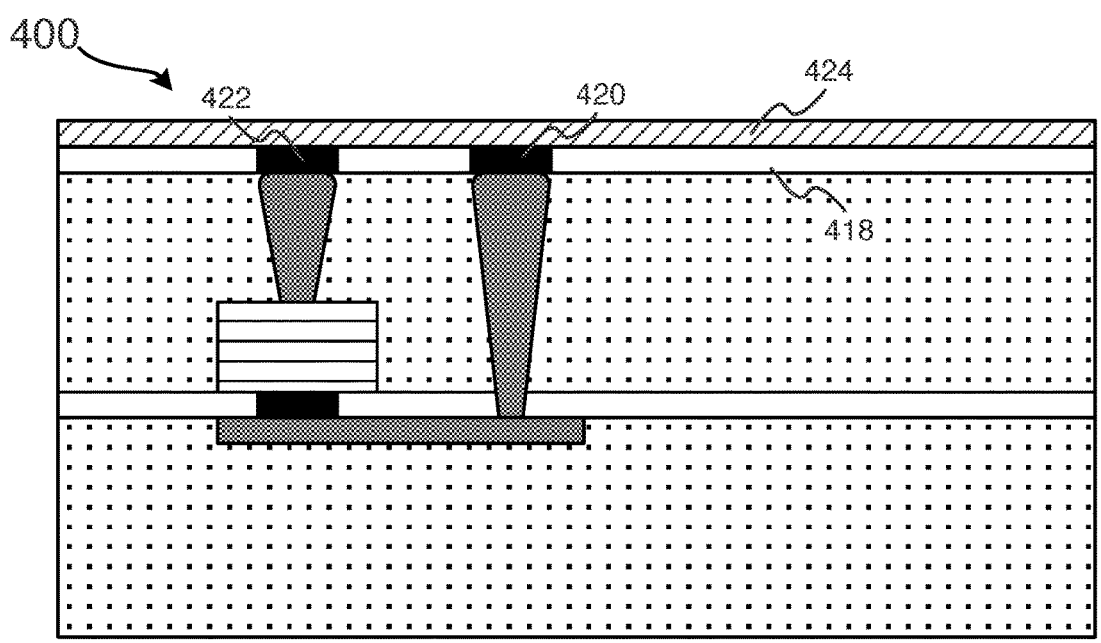
FIG. 4D depicts a side view of a fourth stage of forming an antenna structure that can be used to form a conductive filament in a ReRAM module in accordance with embodiments of the present disclosure.

FIG. 4D depicts a side view of a fourth stage of forming an antenna structure that can be used to form a conductive filament in a ReRAM module in accordance with embodiments of the present disclosure. In FIG. 4D, metal layer 424 has been deposited on top of insulating layer 418. For example, metal layer 424 may take the form of a metal foil that is adhered to insulating layer 418 with a thin layer of resin. Because metal layer 424 has not been etched, it forms electrical connections with both contact 420 and contact 422.

Figure 4E:
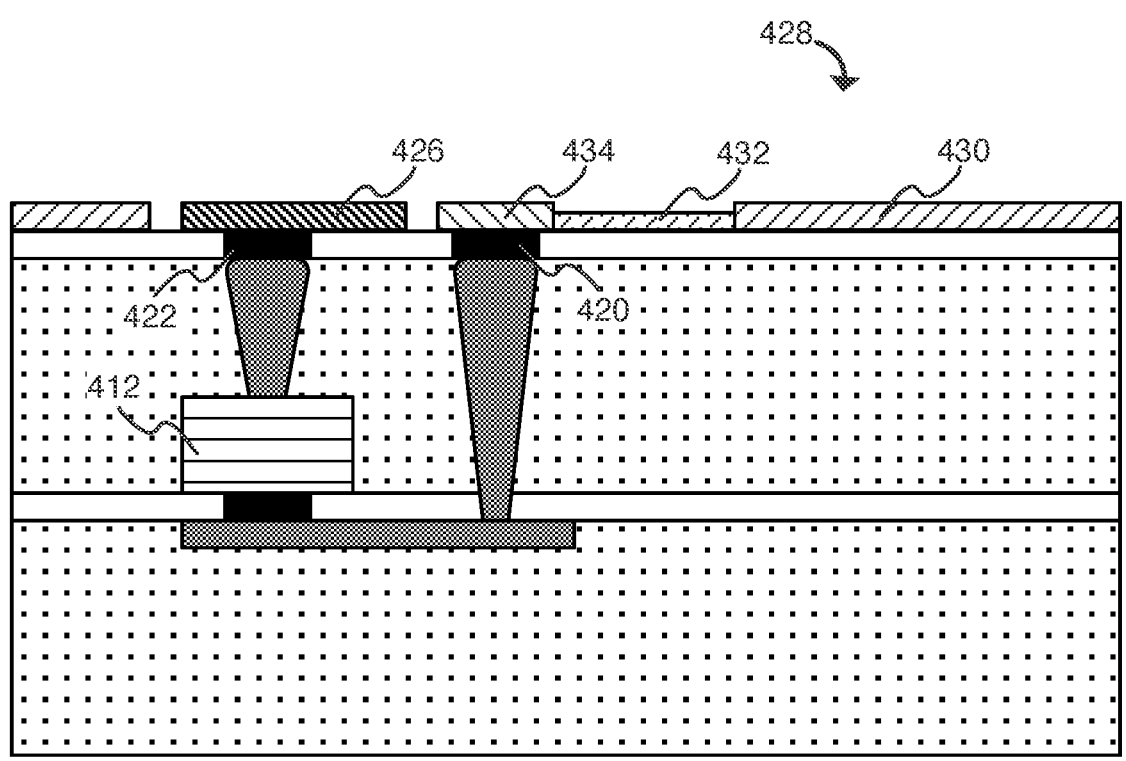
FIG. 4E depicts a side view of a fifth stage of forming an antenna structure that can be used to form a conductive filament in a ReRAM module in accordance with embodiments of the present disclosure.

FIG. 4E depicts a side view of a fifth stage of forming an antenna structure that can be used to form a conductive filament in a ReRAM module in accordance with embodiments of the present disclosure. In FIG. 4E, metal layer 424 has been selectively etched to create a pair of electrodes 426 and 428. Electrode 426 makes an electrical connection with contact 422. Electrode 428, on the other hand, includes plasma-interacting component 430, resistive component 432, and contact component 434. Contact component 434 forms a connection with contact 420. Resistive component 432 connects plasma-interacting component 430 to contact component 434. The dimensions of resistive component 432 may cause it to have a resistance that is greater than or equal to a target resistance of memristor 412.

As illustrated in FIG. 4E, exposing electrodes 426 and 428 to an application of plasma may create a voltage between electrode 426 and 428. Electrode 426 is etched to comprise a first surface area and electrode 428 is etched to comprise a second surface area. Electrodes 426 and 428 may be designed such that the ratio of the second surface area to the first surface area causes the voltage created by the exposure to plasma at a particular intensity to be high enough to result in oxygen-vacancy defects in memrister 412.

As discussed in relation to FIGS. 1D and 1E, the shape of antenna electrodes on an insulative layer can expose some of the surface of the insulative layer to application of plasma or an etching process during removal of the antenna electrodes. This can cause the insulative layer to have a recess that exhibits an outline of the shapes of the electrodes. In some embodiments, the outline of the shape of one of the antenna electrodes can include an outline of the shape of the antenna electrode's resistive component. This outline can take the form of a circuitous line, as illustrated in FIG. 1E. The precise form of this circuitous line may not have a strong impact on the effectiveness of the embodiments of this disclosure, however, the dimensions of the resistive component that results in this circuitous line may be manipulated to create a target resistance value.

Figure 5:
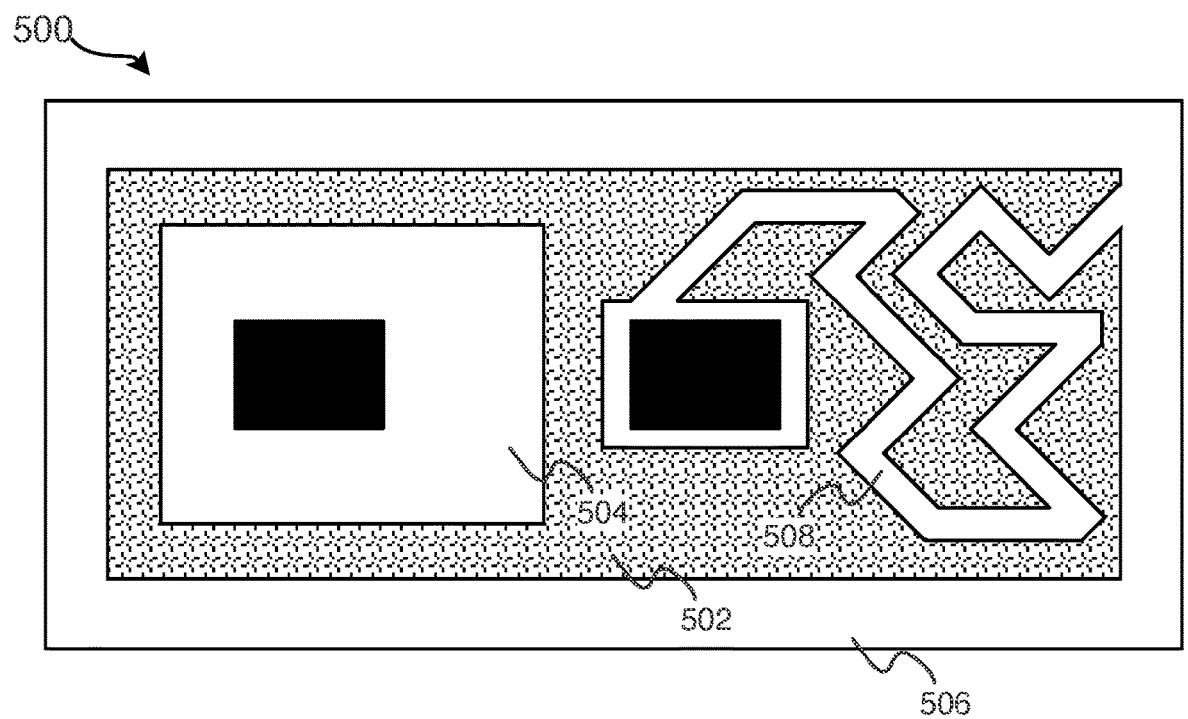
FIG. 5 depicts a top view of an insulative layer on which a recess that displays the outline of a jagged shape of a resistive component, in accordance with embodiments of the present disclosure.

FIG. 5 depicts a top view of an insulative layer 500 on which a recess 502 that displays the outline of a jagged shape of a resistive component, in accordance with embodiments of the present disclosure. Recess 502 exhibits an outline of shape 504 of a first antenna electrode and an outline of shape 506 of a second antenna electrode. Of note, insulative layer 500 is not illustrated as including actual antenna electrodes, but the non-recessed shapes of antenna electrodes that remain after removal of the antenna electrodes with an etching process.

Outline of shape 506 of the second antenna electrode includes an outline of shape 508 of a resistive component of the second antenna electrode. As illustrated, outline of shape 508 of the resistive component takes the form of a jagged, circuitous line without a clear pattern. However, other shapes of circuitous lines may be possible, such as curved lines, or the back-and-forth line illustrated in FIG. 1E.

Figure 6:
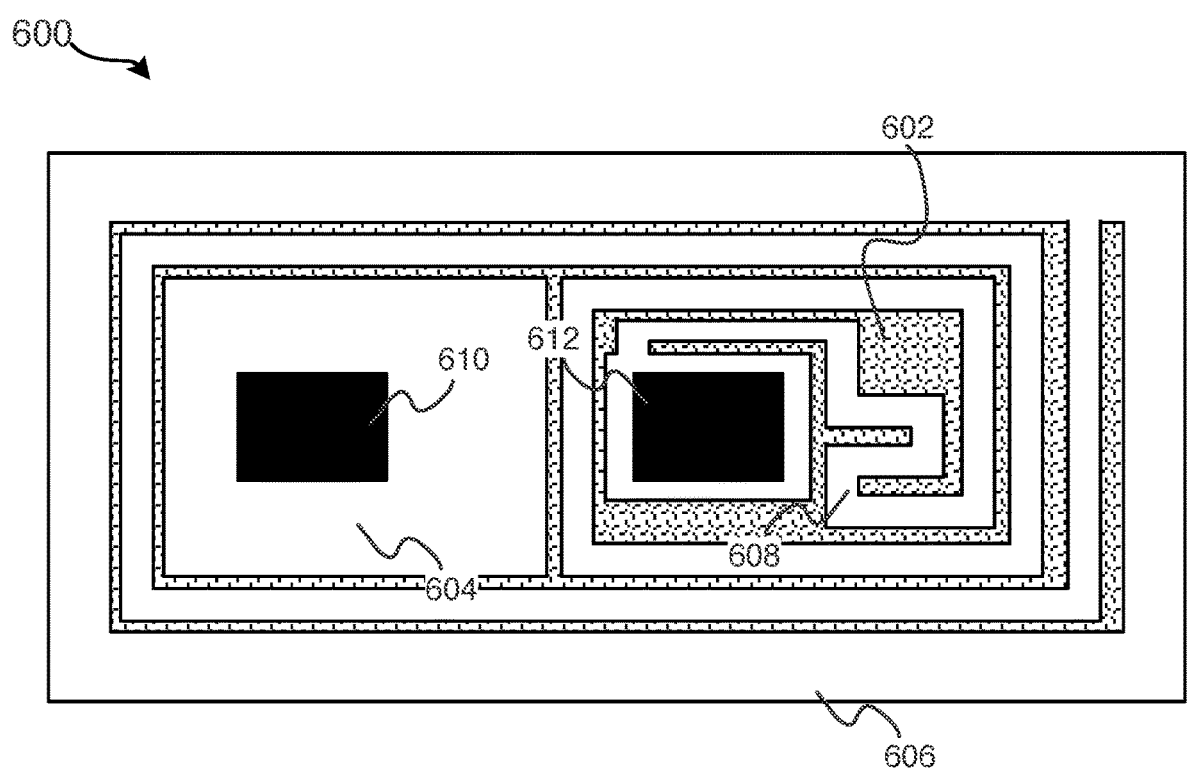
FIG. 6 depicts a top view of an insulative layer on which a recess that displays the outline of a spiral shape of a resistive component, in accordance with embodiments of the present disclosure.

FIG. 6 depicts a top view of an insulative layer 600 on which a recess 602 that displays the outline of a rectilinear spiral shape of a resistive component, in accordance with embodiments of the present disclosure. Recess 602 exhibits an outline shape 604 of a first antenna electrode and an outline of shape 606 of a second antenna electrode. Outline of shape 606 of the second antenna electrode includes an outline of shape 608 of a resistive component of the second antenna electrode. Also depicted in FIG. 6 are contacts 610 and 612.

As illustrated, outline of shape 608 of the resistive component takes the form of a spiral, circuitous line. The spiral circuitous line spirals around both contacts 610 and 612, and again around contact 612. For this reason, the overall surface area of recess 602 is significantly reduced as compared to recess 502 of FIG. 5 or recess 142 of FIG. 1E. This may beneficially avoid excess damage to insulative layer 600 from application of plasma during the formation of a conductive filament, or from etching during the removal of antenna electrodes.

Figure 7:
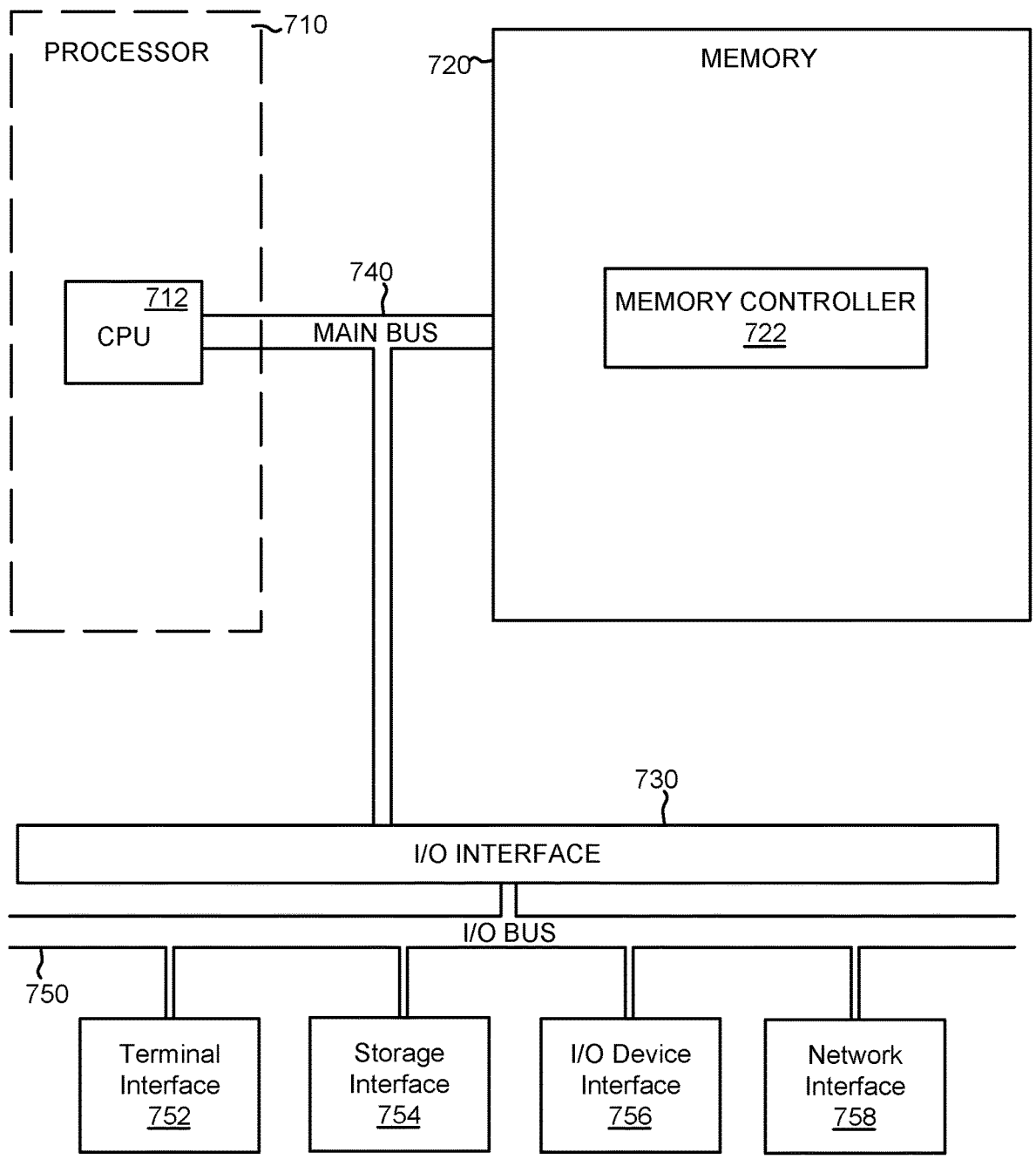
FIG. 7 depicts the representative major components of a computer system that may be used in accordance with embodiments.

FIG. 7 depicts the representative major components of an example Computer System 701 that may be used in accordance with embodiments of the present disclosure. The particular components depicted are presented for the purpose of example only and are not necessarily the only such variations. The Computer System 701 may include a Processor 710, Memory 720, an Input/Output Interface (also referred to herein as I/O or I/O Interface) 730, and a Main Bus 740. The Main Bus 740 may provide communication pathways for the other components of the Computer System 701. In some embodiments, the Main Bus 740 may connect to other components such as a specialized digital signal processor (not depicted).

The Processor 710 of the Computer System 701 may include one or more CPUs 712. The Processor 710 may additionally include one or more memory buffers or caches (not depicted) that provide temporary storage of instructions and data for the CPU 712. The CPU 712 may perform instructions on input provided from the caches or from the Memory 720 and output the result to caches or the Memory 720. The CPU 712 may include one or more circuits configured to perform one or methods consistent with embodiments of the present disclosure. In some embodiments, the Computer System 701 may contain multiple Processors 710 typical of a relatively large system. In other embodiments, however, the Computer System 701 may be a single processor with a singular CPU 712.

The Memory 720 of the Computer System 701 may include a Memory Controller 722 and one or more memory modules for temporarily or permanently storing data (not depicted). In some embodiments, the Memory 720 may include a random-access semiconductor memory, storage device, or storage medium (either volatile or non-volatile) for storing data and programs. The Memory Controller 722 may communicate with the Processor 710, facilitating storage and retrieval of information in the memory modules. The Memory Controller 722 may communicate with the I/O Interface 730, facilitating storage and retrieval of input or output in the memory modules. In some embodiments, the memory modules may be dual in-line memory modules.

The I/O Interface 730 may include an I/O Bus 750, a Terminal Interface 752, a Storage Interface 754, an I/O Device Interface 756, and a Network Interface 758. The I/O Interface 730 may connect the Main Bus 740 to the I/O Bus 750. The I/O Interface 730 may direct instructions and data from the Processor 710 and Memory 720 to the various interfaces of the I/O Bus 750. The I/O Interface 730 may also direct instructions and data from the various interfaces of the I/O Bus 750 to the Processor 710 and Memory 720. The various interfaces may include the Terminal Interface 752, the Storage Interface 754, the I/O Device Interface 756, and the Network Interface 758. In some embodiments, the various interfaces may include a subset of the aforementioned interfaces (e.g., an embedded computer system in an industrial application may not include the Terminal Interface 752 and the Storage Interface 754).

Logic modules throughout the Computer System 701—including but not limited to the Memory 720, the Processor 710, and the I/O Interface 730—may communicate failures and changes to one or more components to a hypervisor or operating system (not depicted). The hypervisor or the operating system may allocate the various resources available in the Computer System 701 and track the location of data in Memory 720 and of processes assigned to various CPUs 712. In embodiments that combine or rearrange elements, aspects of the logic modules' capabilities may be combined or redistributed. These variations would be apparent to one skilled in the art.

The present invention may be a system, a method, and/or a computer program product at any possible technical detail level of integration. The computer program product may include a computer readable storage medium (or media)

having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method of forming a conductive filament in a ReRAM module, the method comprising:
exposing a first electrode and a second electrode to an application of plasma, wherein the first electrode is proximately connected to a first end of a ReRAM module and wherein the second electrode is proximately connected to a second end of the ReRAM module, wherein the second electrode comprises:
a plasma-interacting component; and
a resistive component located between the plasma-interacting component and the ReRAM module;
wherein exposing the first and second electrodes to the application of plasma creates a voltage between the first and second electrodes, and wherein the voltage creates the conductive filament in the ReRAM module.

2. The method of claim 1, further comprising etching away the first and second electrodes after the application of plasma.

3. The method of claim 1, further comprising etching away the first electrode after the application of plasma.

4. The method of claim 1, further comprising etching away the second electrode after the application of plasma.

5. The method of claim 1, wherein the resistive component and the plasma-interacting component are composed of a same material, and wherein a resistance of the resistive component is caused primarily due to the length, width, and height of the resistive component.

6. The method of claim 5, wherein the resistance of the resistive component is less than or equal to a target resistance value for the conductive filament.

7. The method of claim 1, further comprising connecting at least one of the first end and the second end the ReRAM module to a memory-cell transistor in the memory structure.

8. The method of claim 1, further comprising:
determining that the resistance of the ReRAM module has reached a target resistance value; and
terminating, in response to the determining, the exposure to the application of plasma.

9. The method of claim 1, further comprising:
integrating the ReRAM module in a substrate;
forming an electrical connection between the first end of the ReRAM module and a first contact, wherein the first contact is embedded within the insulative layer;
forming an electrical connection between the second end of the ReRAM module and a second contact, wherein the second contact is embedded within the insulative layer;
depositing a layer of metal on the insulative layer; and
etching a pattern in the layer of metal, resulting in the first electrode attached to the first contact and the second electrode attached to the second contact.

10. A memory structure comprising:
a ReRAM module embedded in a substrate;
an insulative layer on a surface of the substrate;
a first electrode on a surface of the insulative layer, wherein the first electrode is proximately connected to a first end of the ReRAM module and comprises a first surface area; and
a second electrode on the surface of the insulative layer, wherein the second electrode is proximately connected to a second end of the ReRAM module and comprises:
a second surface area;
a plasma-interacting component on the surface of the insulative layer; and
a resistive component located on the surface of the insulative layer between the plasma-interacting component and the ReRAM module;
wherein a ratio of the first surface area to the second surface area creates a formation voltage between the first electrode and second electrode when the first surface area and second surface area are exposed to an application of plasma during formation of a conductive filament.

11. The memory structure of claim 10, wherein the first electrode and second electrode are composed of a material that can be chemically etched off the insulative layer.

12. The memory structure of claim 10, wherein the first electrode is composed of a material that can be chemically etched off the insulative layer.

13. The memory structure of claim 10, wherein the second electrode is composed of a material that can be chemically etched off the insulative layer.

14. The memory structure of claim 10, wherein the conductive filament has a target resistance value.

15. The memory structure of claim 14, wherein the resistive component provides a first resistance between the first electrode and the second electrode, wherein the first resistance is less than or equal to the target resistance value.

16. The memory structure of claim 10, wherein at least one of the first end and the second end of the ReRAM module is connected to a memory-cell transistor in the memory structure.

17. A memory structure comprising:
a ReRAM module that comprises a first end and a second end;
a substrate;
an insulative layer on a surface of the substrate; and
a recess in the insulative layer, wherein the recess exhibits an outline of a shape of a first antenna electrode and an outline of a shape of a second antenna electrode.

18. The memory structure of claim 17, further comprising:
a first contact and a second contact on the surface of the substrate, wherein the first contact is proximately connected to the first end with respect to the second end and the second contact is proximately connected to the second end with respect to the first end.

19. The memory structure of claim 17, wherein the outline of the shape of the second antenna electrode includes an outline of a shape of a resistive component.

20. The memory structure of claim 19, wherein the outline of the shape of the resistive component takes the form of an outline of a circuitous line.

* * * * *